(12) United States Patent
Ahmed et al.

(10) Patent No.: US 6,771,012 B2
(45) Date of Patent: Aug. 3, 2004

(54) APPARATUS FOR PRODUCING A FLUX OF CHARGE CARRIERS

(75) Inventors: Haroon Ahmed, Cambridge (GB); David Hasko, Haddenham (GB); Alex Driskill-Smith, Speldhurst (GB); David Arfon Williams, Cambridge (GB)

(73) Assignee: Hitachi Europe, Ltd., Maidenhead (GB)

( * ) Notice: Subject to any disclaimer, the term of this patent is extended or adjusted under 35 U.S.C. 154(b) by 161 days.

(21) Appl. No.: 09/802,975

(22) Filed: Mar. 12, 2001

(65) Prior Publication Data

US 2001/0040215 A1 Nov. 15, 2001

(30) Foreign Application Priority Data

Mar. 16, 2000 (EP) .............................................. 00302144

(51) Int. Cl.[7] ................................................ H01J 37/73
(52) U.S. Cl. ........................ 313/336; 250/306; 313/309
(58) Field of Search ................................ 250/306, 310; 313/309, 336

(56) References Cited

U.S. PATENT DOCUMENTS

| | | | |
|---|---|---|---|
| 5,122,663 A | * | 6/1992 | Chang et al. ................ 250/310 |
| 5,478,698 A | | 12/1995 | Rostoker et al. |
| 5,587,586 A | * | 12/1996 | Kruit ...................... 250/423 F |
| 5,654,548 A | | 8/1997 | Fink et al. |
| 5,773,921 A | * | 6/1998 | Keesmann et al. ......... 313/309 |
| 5,955,850 A | | 9/1999 | Yamaguchi et al. |
| 6,019,913 A | | 2/2000 | Dinh et al. |
| 6,283,812 B1 | * | 9/2001 | Jin et al. ....................... 445/24 |

FOREIGN PATENT DOCUMENTS

| | | |
|---|---|---|
| EP | 0 366 851 | 5/1990 |
| EP | 0 633 593 A1 | 1/1995 |
| EP | 0 905 737 A1 | 3/1999 |
| WO | WO 96/10836 | 4/1996 |
| WO | WO 97/18577 | 5/1997 |

OTHER PUBLICATIONS

"Nanoscale field emission structures for ultra-low voltage operation at atmospheric pressure", Driskill–Smith et al.Applied Physics Letters, volune 75, pp 2845–2847 (1999).*

"Hybrid atomic force/scanning tunneling lithography", K. Wilder, et al., Journal of Vacuum Science and Technology, vol. B15, pp. 1811–1817 (1997).

"Experimental evaluation of a 20x20 mm footprint microcolumn", E. Kratschmer, et al., Journal of Vacuum Science and Technology, vol. B14, pp 3792–3796 (1996).

(List continued on next page.)

*Primary Examiner*—John R. Lee
*Assistant Examiner*—James J. Leybourne
(74) *Attorney, Agent, or Firm*—Kenyon & Kenyon

(57) ABSTRACT

Apparatus for producing a flux of charge carriers that may be used in many applications including imaging and lithography comprises an electron source which includes an emitter with a tip radius of about one nanometer and a closely configured extractor, together with a specimen for receiving an electron beam from the source. The apparatus may operate in air under atmospheric conditions and at a much reduced operating voltage.

38 Claims, 10 Drawing Sheets

OTHER PUBLICATIONS

"Nanoscale Field Emission Structures for Ultra–Low Voltage Operation At Atmospheric Pressure", A.A. G. Driskill–Smith, et al. Applied Physics Letters, vol. 71, pp. 3159–3161 (1997).

"A Nanoscale Field–Emission Tube" by A.A. G. Driskill–Smith, et al., Applied Physics Letters, vol. 75, pp. 2845–2847 (1999).

Fabrication of Integrated Micromachined Electron Guns, W. Hofmann, et al., Journal of Vacuum Science & Technology: Part B, US, American Institute of Physics, New York, vol. 13, NR, 6, Page(s) 2701–2704.

"Scanning Electron Microscope Using Atomically Fine Field Emission Tip", IBM Technical Disclosure Bulletin, US IBM Corp.., New York, vol. 37, NR. 10, pp 463–465.

"A Novel Scanning Tunneling Microscope Controlled Field Emission Microlens Electron Source", Journal of Vacuum Science and Technology: Part B, US, American Institute of Physics. New York, vol. 7, NR. 6, pp. 1851–1854.

"Integrated Polysilicon and DRIE Bulk Silicon Micromachining for an Electrostatic Torsional Actuator", by J–L. A. Yeh, et al., Journal of Micromechanical Systems, vol. 8, pp 456–465 (1999).

* cited by examiner

APPARATUS FOR PRODUCING A FLUX OF CHARGE CARRIERS

FIELD OF THE INVENTION

The present invention relates to apparatus for producing a flux of charge carriers.

BACKGROUND OF THE INVENTION

Apparatus for producing a flux of charge carriers have a variety of uses in many different applications. They may be put to use in displays for consumer electronics, in imaging and diagnostic systems used in research and development applications, in switching and amplifying circuits in sensors and in lithography systems for manufacturing.

In the field of imaging and lithography, apparatus for producing a flux of charge carriers may be used as proximity probes as well as to generate electron beams.

One type of proximal probe is a scanning tunnelling microscope (STM).

A STM comprises a tip that is scanned over the surface of a specimen. Electrons are emitted from the tip and tunnel into the specimen. The rate of tunnelling is highly sensitive to the separation of the tip and specimen and the measured current, together with the position of the tip, may be used to build an image of the specimen.

Although STM imaging has very high resolution, it has several disadvantages. For example, the tip is mechanically, rather than electrically, scanned across the specimen, thus reducing its raster speed compared with electron beam systems. Furthermore, image information may only be obtained from primary electrons, in this case, electrons tunnelling between the tip and the specimen. This may be compared with other electron imaging systems in which image information may also be obtained from secondary electrons that are generated when sufficiently energetic primary electrons strike the specimen. Another disadvantage is that the specimen must be arranged a few nanometers from the tip of the STM for electron tunnelling to occur. This is difficult to achieve and attempts to position the tip often result in the tip crashing into the specimen.

An example of using an STM in lithography is given in "Hybrid atomic force/scanning tunnelling lithography" by K. Wilder, H. T. Soh, A. Atalar and C. F. Quate, Journal of Vacuum Science and Technology, volume B15, pp 1811–1817 (1997).

Another type of apparatus for producing a flux of charge carriers and which may be used for imaging and lithography is microcolumn electron beam system. A microcolumn is a miniaturised version of a conventional electron beam system and an example of a microcolumn is given in "Experimental evaluation of a 20×20 mm footprint microcolumn" by E. Kratschmer, H. S. Kim, M. G. R. Thomson, K. Y. Lee, S. A. Rishton, M. L. Yu, S. Zolgharnain, B. W. Hussey and T. H. P. Chang, Journal of Vacuum Science and Technology, volume B14, pp 3792–3796 (1996).

A microcolumn comprises a field emitter, a beam-forming source lens, scanning electrodes and a beam focussing objective lens. The electrode and lenses are arranged around the axis of the column only a few millimeters long. The microcolumn operates with beam voltages of the order of 100–1000 volts.

One advantage of a microcolumn over larger electron beam systems is that lens aberration is reduced. Furthermore, an array of microcolumns separated from one another by a few millimeters may be used in parallel to expose the surface of a wafer. However, microcolumns have several disadvantages. For example, a microcolumn operates under high vacuum conditions, requiring the sample to be kept in a vacuum. This prohibits imaging of a sample in air, which would be advantageous in biological applications. Furthermore, microcolumns are generally complex and expensive to manufacture. In addition, the minimum beam voltage that can be used is limited by space charge, where electrons within the beam repel each other and cause the beam to broaden. A broader beam results in loss of resolution for lithography and imaging.

Electron beams can also be used to determine the composition of sample. For example, conventional scanning electron microscopes (SEMs) may be used to perform energy dispersive X-ray (EDX) spectroscopy and wave dispersive spectroscopy (WDS). However, the instruments used for these types of spectroscopy are cumbersome and require keeping in a vacuum. This prevents analysis of large samples or specimens that can only be analysed in air.

Apparatus for producing a flux of charge carriers may be used in flat panel displays. One type of device is a field emitting display device used in flat panel displays. An example of such a device may be found in U.S. Pat. No. 5,955,850 and comprises an array of field emitters, each comprising a conical cathode and an extractor electrode, and a common anode. The device may be fabricated using standard microelectronic processing techniques on a common substrate. However, the device has several disadvantages. The space between the cathode and the anode must be evacuated and the operative voltage is in the region of 1000's of volts.

Recently, a field emission device has been developed that has a much reduced operating voltage. The device is described in "Nanoscale field emission structures for ultralow operation at atmospheric pressure" by A. A. G. Driskill-Smith, D. G. Hasko and H. Ahmed, Applied Physics Letters, volume 71, pp 3159–3161 (1997). The device comprises an emitter having a tip radius of about one nanometer and a closely configured extractor electrode. This laboratory experimental device allows field emission to occur at very low voltages and the emitted electrons to travel ballistically from the emitter tip to the extractor electrode even under atmospheric conditions.

This device has been modified to produce a nanoscale electron tube and is described in "The "nanotriode": A nanoscale field-emission tube" by A. A. G. Driskill-Smith, D. G. Hasko and H. Ahmed, Applied Physics Letters, volume 75, pp 2845–2847 (1999). The device comprises a nanometer-scale chamber comprising an emitter and a closely configured gate electrode, sealed under vacuum by an integrated anode. One of the advantages of the triode is that it has a low operating voltage, while the gate electrode may be used to control the anode current.

However, such a triode is not suitable for generating an electron beam outside of the device because the structure is sealed.

The present invention seeks to provide an improved apparatus for producing a flux of charge carriers.

SUMMARY OF THE INVENTION

According to the present invention there is provided apparatus for producing a flux of charge carriers comprising a source which comprises an emitter having a nanometer scale tip radius on a common substrate with an extractor arranged no more than 50 nm from the emitter to extract charge carriers therefrom and a specimen adjacent the source, to receive a flux of charge carriers from the source.

The emitter may have a tip radius less than 2 nm or less than 1 nm.

According to the present invention there is also provided apparatus for producing a flux of charge carriers comprising a source which comprises an emitter and an extractor to extract charge carriers from the emitter, wherein the emitter and the extractor are configured on a common substrate and a specimen, wherein the emitter and the specimen are arranged in a near-field configuration.

In the near-field configuration phase coherence of the charge carriers may be substantially maintained.

The near-field configuration may comprise an arrangement whereby the emitter and the specimen are disposed less than 200 nm from each other.

The extractor may be arranged no more than 50 nm from the emitter.

The extractor may be arranged no more than 30 nm from the emitter.

According to the present invention there is still further provided apparatus for producing a flux of charge carriers comprising a source which comprises an emitter and an extractor to extract charge carriers from the emitter, wherein the emitter and the extractor are configured so as to allow extraction of charge carriers under a gaseous atmosphere without ionisation of the gas and wherein a specimen adjacent the source, to receive a flux of charge carriers from the source.

The emitter and extractor may be configured such that said charge carriers are extracted while a bias is applied to the extractor relative to the emitter.

The relative applied bias may be positive and between 7 to 20 V.

According to the present invention there is further provided apparatus for producing a flux of charge carriers comprising a source which comprises an emitter and an extractor to extract charge carriers from the emitter and configured to extract charge carriers while a turn-on bias of less than 100V is applied to the extractor relative to the emitter and a specimen adjacent the source, to receive a flux of charge carriers from the source.

The turn-on bias may be less than 10V.

The apparatus may include a bias source to apply a bias to the specimen relative to the emitter.

The bias applied by the source to the specimen may be positive relative to the emitter and between 14 to 40 V relative to the emitter.

The emitter may comprise a metal, for example tungsten.

The emitter may comprise a tip member, for example comprising an alloy of gold and palladium, with a radius less than 2 nm.

The extractor may comprise tungsten and may comprise a sheet having an aperture.

The diameter of the aperture may be less than 100 nm or 50 nm.

The source may further comprise means for collecting charge carriers.

The source may further comprise means for deflecting flux of charge carriers.

The source may further comprise means for focussing the flux of charge carriers.

The flux of charge carriers may be a charge carrier beam.

The apparatus may be configured to operate in air at atmospheric pressure.

The charge carriers may be electrons.

The emitter and the specimen may be disposed less than 200 nm from each other.

According to the present invention there is also provided a method of producing a flux of charge carriers, the method comprising providing a source comprising configuring an emitter having a nanometer scale tip radius on a substrate with an extractor arranged no more than 50 nm from the emitter to extract charge carriers therefrom and wherein providing a specimen adjacent the source, to receive a flux of charge carriers from the source.

According to the present invention there is also provided a method of fabricating a source, the method comprising depositing a thin film and allowing said thin film to coalesce into individual particles.

BRIEF DESCRIPTION OF THE DRAWINGS

Embodiments of the present invention will now be described by way of example with reference to the following drawings in which.

DESCRIPTION OF PREFERRED EMBODIMENTS

First Embodiment

Electron Source Structure

Figure 1:
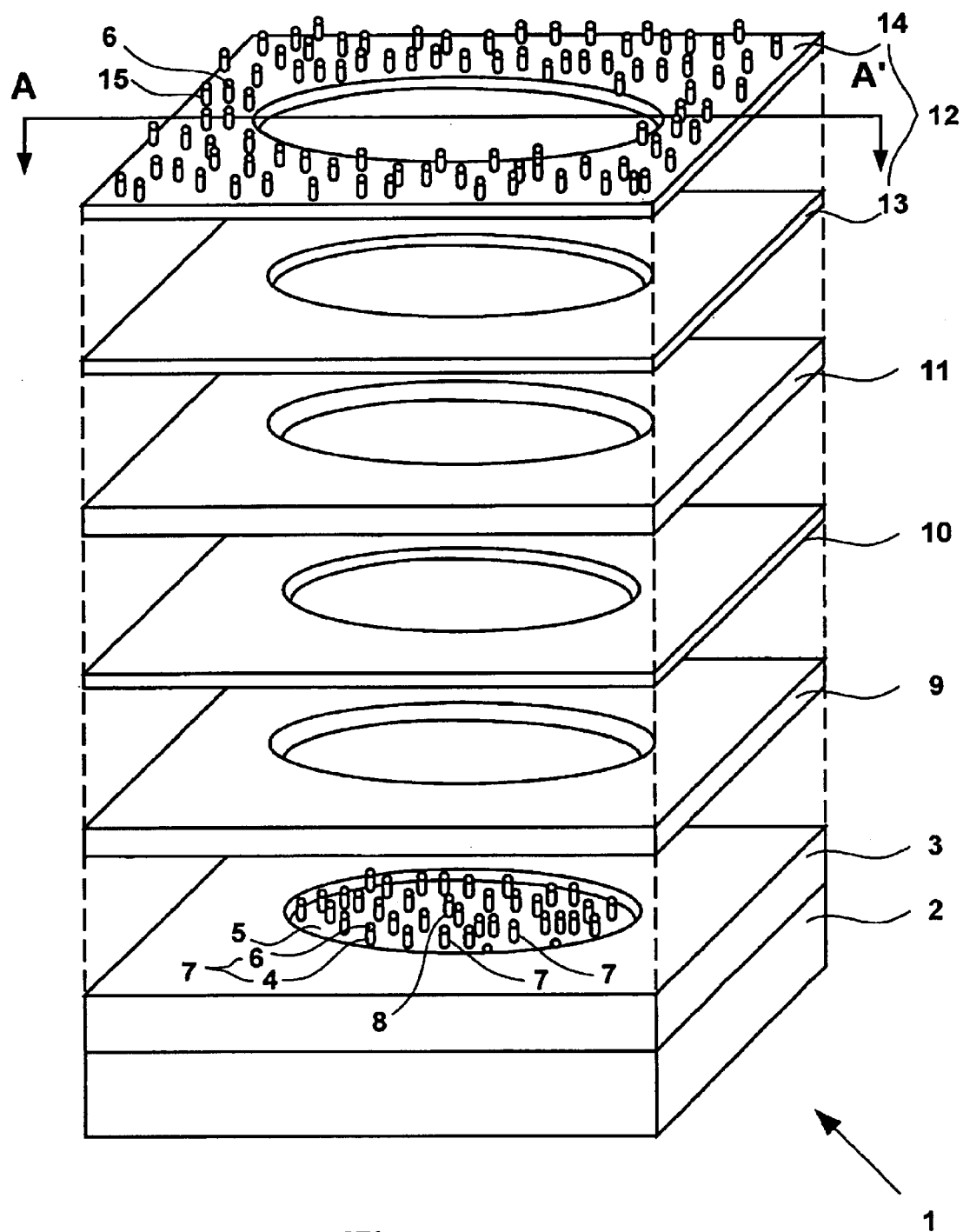
FIG. 1 is an exploded perspective view of a first embodiment of an electron source.
Figure 2:
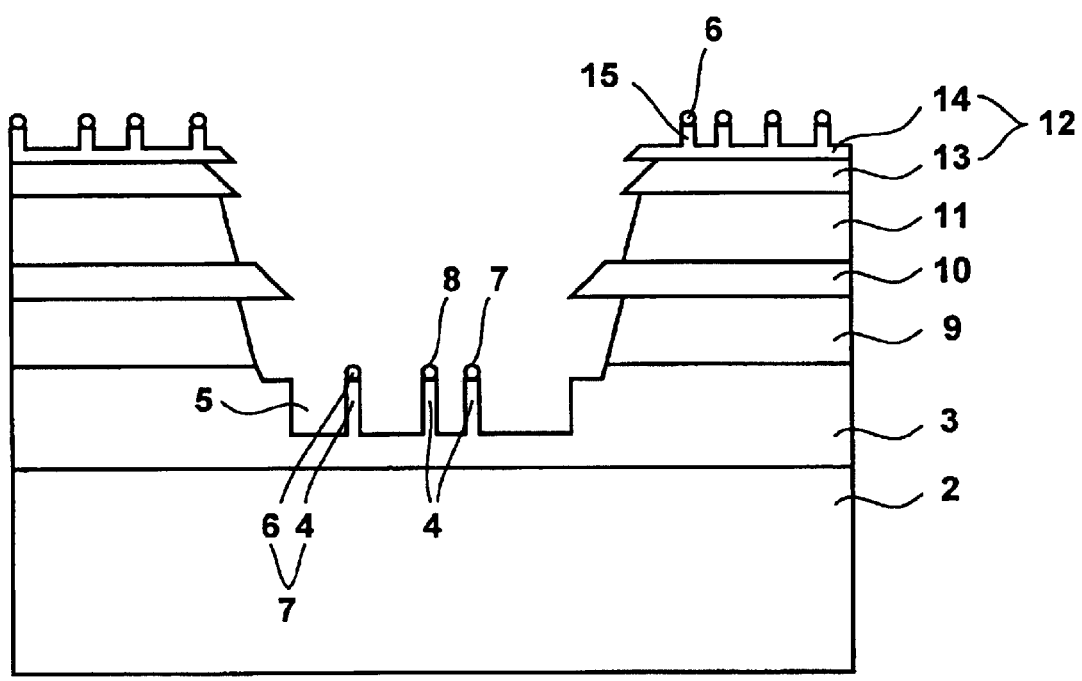
FIG. 2 is cross-sectional view of the first embodiment of an electron source taken along the line A–A' as shown in FIG. 1.

Referring to FIGS. 1 and 2, a first embodiment of an electron source 1 is shown in an exploded perspective view and in cross-section respectively.

The source 1 comprises an insulating substrate 2 on which is disposed a cathode layer 3. The insulating substrate comprises silicon dioxide grown on single crystal silicon. The cathode layer 3 comprises tungsten and has a thickness of 100 nm. A plurality of conductive posts 4 are upstanding from a shallow recess 5, which is 15 nm deep and is substantially circular in plan view, in the cathode layer 3 and have particles 6 sitting thereon so as to form a plurality of pillars 7. In this example, an individual particle 6 sits on each post 4. The posts 4 comprise tungsten and have an aspect ratio of approximately 10 to 1. The conductive particles 6 comprise an alloy of gold and palladium and have a diameter of less than 1 nm, although conductive particles 6 having diameters in a range of less than 50 nm may be used. Preferably, the conductive particles 6 have diameters less than 10 nm. More preferably, the conductive particles 6 have diameters less than 2 nm.

One of the pillars 7 forms an emitter 8 by a self-selecting process, the details of which will be described later. The radius of the tip of the emitter 8 is defined by the size of the conductive particle 6.

An insulating layer 9 overlies the cathode layer 3 and separates an extractor electrode 10 from the cathode layer 3. The insulating layer 9 comprises silicon dioxide and has a thickness of 50 nm. The extractor electrode layer 10 comprises tungsten and has a thickness of 20 nm. Both the insulating layer 9 and the extractor electrode 10 have apertures, the centres of which are substantially coaxial with the centre of the recess 5. The extractor electrode 10 causes cold emission of electrons from the tip of the emitter 8, when positively biased relative to the cathode layer 3.

A dielectric layer 11, for example comprising silicon dioxide having a thickness of 50 nm, overlies the extractor electrode 10 and separates a collector 12 from the extractor electrode 10. The collector 12 comprises a collector layer 13 and a capping layer 14. In this example, the collector layer 13 comprises tungsten and has a thickness of 30 nm, while the capping layer 14 comprises aluminium and has a thickness of 10 nm. The dielectric layer 11, the collector layer 13 and the capping layer 14 have apertures, the centres of which are substantially coaxial with the centre of the recess 5. A plurality of conductive posts 15 are upstanding from the surface of the capping layer 14 furthermost from the substrate 2 and have conductive particles 6 sitting thereon so as to form a plurality of pillars. In this example an individual particle 6 sits on each post 15.

The apertures are substantially circular in plan view and have diameters of approximately 50 nm, although apertures having diameters in the range of 10–100 nm may be used. Preferably, the apertures have diameters in the range of 10–50 nm. The apertures may be elliptical or regularly or irregularly polygonal. The edges of the apertures may be rough.

An advantage of using an emitter with such a small radius is that the energy spread of the emitted electrons is reduced. Furthermore, the beam brightness is increased. This is because the conductive particle 6 comprises a cluster of just a few atoms. The small size of the cluster results in quantisation of electronic states, which filters energy of electrons tunnelling from the conductive post into the cluster, thus reducing energy spread. The geometry of the tip causes concentration of the local electric field, resulting in a higher rate of emission of electrons.

Configuration of the Electron Source and Specimen

Figure 3:
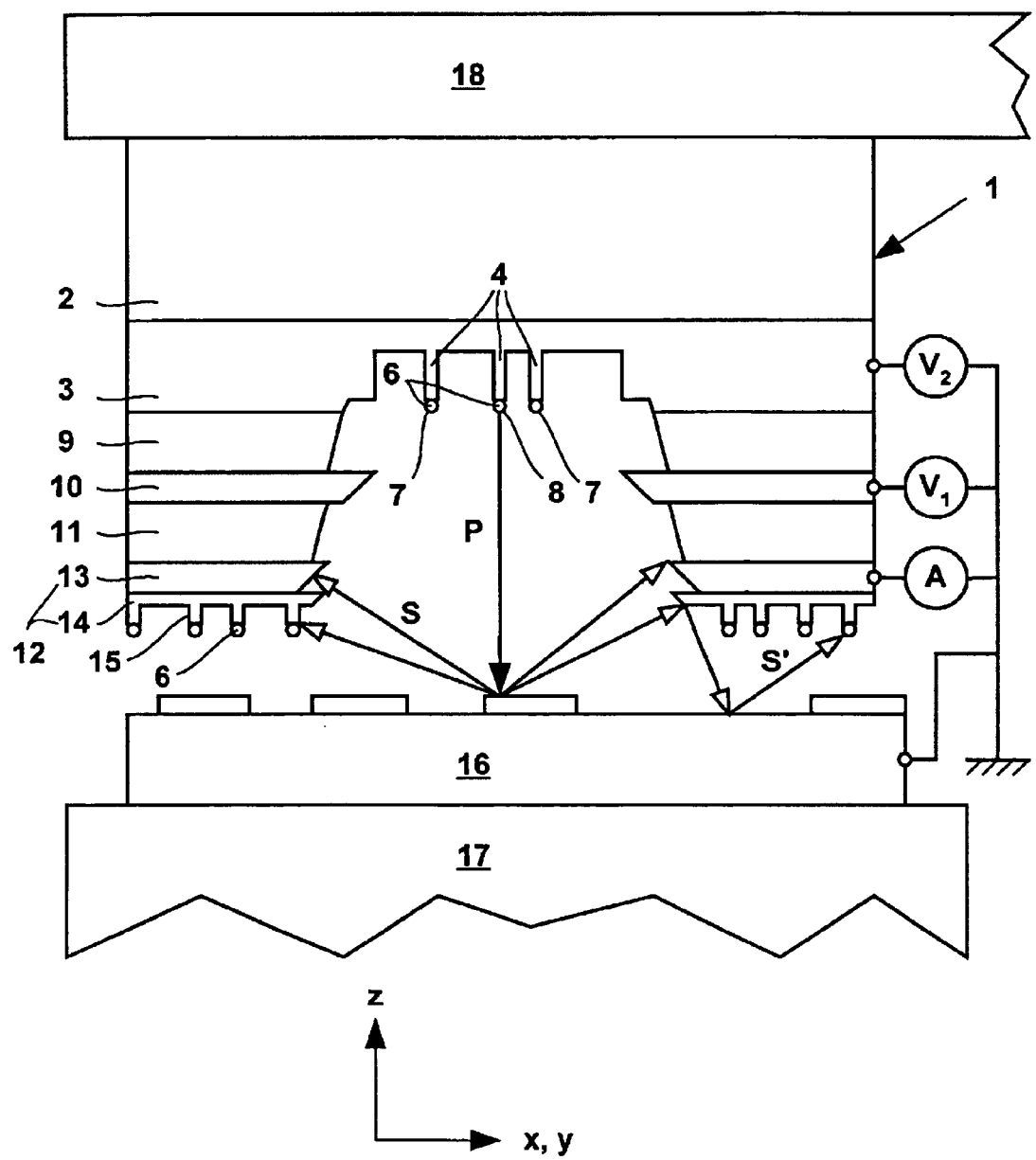
FIG. 3 shows a first embodiment of the present invention.

Referring to FIG. 3, a first embodiment of the present invention is a scanning electron microscope comprising the electron source 1 as described with reference to FIGS. 1 and 2 and a specimen 16. In this example, the specimen 16 is a semiconductor chip.

The specimen 16 is arranged substantially parallel to the layers comprising the source 1 on a moveable x-y stage 17 driven by stepper motors (not shown). The position of the stage 17 is accurately determined using well-known laser interferometric techniques. The electron source 1 is arranged on a piezoelectric translator 18, similar to those used for scanning probe microscopes. The separation of the tip of the emitter 8 from the facing surface of the specimen 16 is about 200 nm.

Unlike conventional electron beam systems, including microcolumns, the source 1 and the specimen 16 sit in air at room temperature and atmospheric pressure. The reason for this is that the specimen 16 is arranged in a near-field configuration relative to the tip of the emitter 8 and this will be discussed later in more detail.

To produce an electron beam P, the specimen 16 is grounded and first and second biases $V_1=-8V$ and $V_2=-15V$ are applied to the extractor electrode 10 and the cathode layer 3 respectively. However, a first bias in the range $-1 \geq V_1 \geq -20V$ and a second bias in the range $-1 \geq V_2 \geq -20V$ could be used. A person skilled in the art will be able to determine what biases may be applied to the extractor electrode 10, cathode layer 3 and the specimen 16 in order to produce an electron beam P and to prevent insulating layer and dielectric layer breakdown. This may include application of positive biases.

The theory of operation of the source is not fully understood and the following discussion is presented by way of non-limiting explanation. The pillars 7 have slightly different shapes, sizes and other characteristics and it is believed that the pillar 7 having the most favourable conditions for field emission adopts the role of the emitter 8. Field emission becomes possible when the local electric field at the surface of the emitter 8 exceeds approximately $10^9 Vm^{-1}$. A number of factors determine which pillar 7 has the most favourable conditions for field emission, including aspect ratio. A high aspect ratio is advantageous. A higher aspect ratio is achieved by making the pillar taller or having a smaller tip radius. The degree of shielding from surrounding pillars 7 may also determine which pillar becomes the emitter 8. If will be appreciated that conditions at any one pillar 7 may change, thus affecting whether the pillar becomes the most favourable pillar. For example, the emitter 8 may "burn" itself out and may be replaced by the next most favourable pillar. Alternatively, the conditions may change randomly or due to slight changes in applied voltages.

The emitter 8 and specimen 16 form a cathode and an anode respectively. A flux of electrons is directed in a beam P towards the specimen 16. A proportion of the electrons are collected by the extractor electrode 10 and the collector 12 before they reach the specimen 16.

The electron beam P reaches the specimen 16 having an electron beam energy of the order of 10 eV, in this example about 10 eV since the potential difference between the specimen 16 and the cathode layer 3 is 15V and the work function of tungsten is about 5 eV. This is at least an order of magnitude less than conventional electron beam systems, even microcolumns, although such low beam energies have been possible using complicated retarding energy stages. Furthermore, the electron beam energy is at least a factor of three larger than in scanning probe systems. The electron beam energy is a few times that of the work function of the surface of the specimen 16 and thus the electron beam P may be used to probe the surface electronic structure of the specimen 16.

The electron beam P will reach the specimen 16 having a beam diameter of approximately 60 nm or smaller. Preferably, the electron beam P will reach the specimen 16 having a beam diameter less than 10 nm. The beam diameter may be smaller than 60 nm due to a narrow emission angle from the emitter 8 and focussing by the extractor electrode 10 and the collector 12.

In this example, the beam current is of the order of a few nanoamperes.

The electron beam P strikes the specimen 16 and generates secondary electrons S having a lower energy than electrons of the electron beam P (so-called primary electrons), the secondary electrons S are collected by the collector 12. The secondary electrons S may generate further secondary electrons S' with still lower energies. The rate of secondary electron emission is dependent upon surface composition and topography. The greater the rate of secondary electron emission, the higher the current detected by the collector 12.

A personal computer (not shown) runs an application, which controls movement of the x-y stage 17, the piezo translator 18 and measures changes in the collected current A. Thus, an image of the specimen 16 may be obtained and displayed by the computer. It will be appreciated that other, customised systems may be used instead of a personal computer.

The advantage of this scanning electron microscope is that it need not operate under a vacuum. There are two reasons for this. Firstly, little or no scattering of the electron beam P takes place because the separation of the tip of the emitter 8 and the specimen is less than the electron mean free path in air, which is about 200 nm at low electron energies and at atmospheric pressure, i.e. 760 Torr. Secondly, there is no significant degradation of the emitter to impact ionisation because the operating voltage may be lowered below the first ionisation potential of molecules present in the air, namely 12.7 and 15.6 eV for nitrogen and water respectively.

If however, the ambient pressure is reduced below atmospheric pressure, the emitter 8 to specimen 16 separation may be increased. For example, at a pressure of 76 Torr, the electron mean free path is about 2 $\mu$m. Under high-vacuum conditions, the mean-free path limitation is relaxed and near-field condition is governed by geometric considerations.

The near-field configuration may be defined in terms of the behaviour of electrons within the beam P. In the near-field configuration, the phase coherence of the electron beam P is maintained to a high degree. This may be compared with the situation in the far-field configuration, where there is little or no phase coherence. Phase coherence is lost through interactions of electrons with other particles and electromagnetic fields. As the separation between the emitter 8 and the specimen 16 increases, electrons are subject to more interactions. In the case of in-air operation, the most significant interaction is with air molecules. As the mean free path of electrons in air is about 200 nm this is about the limit of separation between the emitter 8 and the specimen 16 for near-field operation. In the case of vacuum operation, the separation may be increased.

Those skilled in the art are able to test the degree of coherence in the electron beam P by routine experiment. For example, the image of a specimen 16 varies according to the degree of coherence of the electron beam P. A simulated image, dependent on the characteristics of the specimen 16 and the degree of coherence of the beam may be calculated. The specimen 16 is characterised using transmission electron microscopy, scanning tunnelling microscopy or atomic force microscopy. This characterisation is used to determine simulated images of the specimen 16 under near- and far-field configurations. The specimen 16 is then imaged at different distances from the source and at different ambient pressures, so as to change the field configuration. These images are compared with each other and with the simulated images to establish the limits of near-field configuration.

It will be appreciated that the electron beam P may be magnetically scanned placing external scan coils (not shown) around the source 1 and the specimen 16.

Electron Source Fabrication

Referring to FIGS. 4a to 4d, a method of fabricating the electron source 1 will now be described.

Using a p-type silicon wafer 2', a silicon dioxide substrate 2 is grown by wet oxidation at 1000° C. The thickness of the silicon dioxide substrate 2 is 200 nm. A plurality of layers 3', 9', 10', 11', 13', 14' are radio frequency sputter deposited under an argon atmosphere in a cold-walled sputter chamber having a base pressure of less than $1 \times 10^{-6}$ Torr in a manner well known per se.

A first layer of tungsten 3' of thickness 100 nm is sputtered and first layer of silicon dioxide 9' of thickness 50 nm is deposited thereon. Then, a second layer of tungsten 10' of thickness 20 nm is deposited. A second layer of silicon dioxide 11' of thickness 50 nm is sputtered followed by a third layer of tungsten 13' of thickness 30 nm. Finally, an aluminium layer 14' of thickness 15 nm is deposited.

Polymethylmethacrylate electron beam resist is applied to the aluminium layer 14', patterned using an 80 kV electron beam of spot size 10 nm. A circular window 19 of diameter 50 nm is left in the electron beam resist 20. The corresponding structure is shown in FIG. 4a.

The remaining electron beam resist 20 serves as a mask to dry and wet etches.

Figure 4:
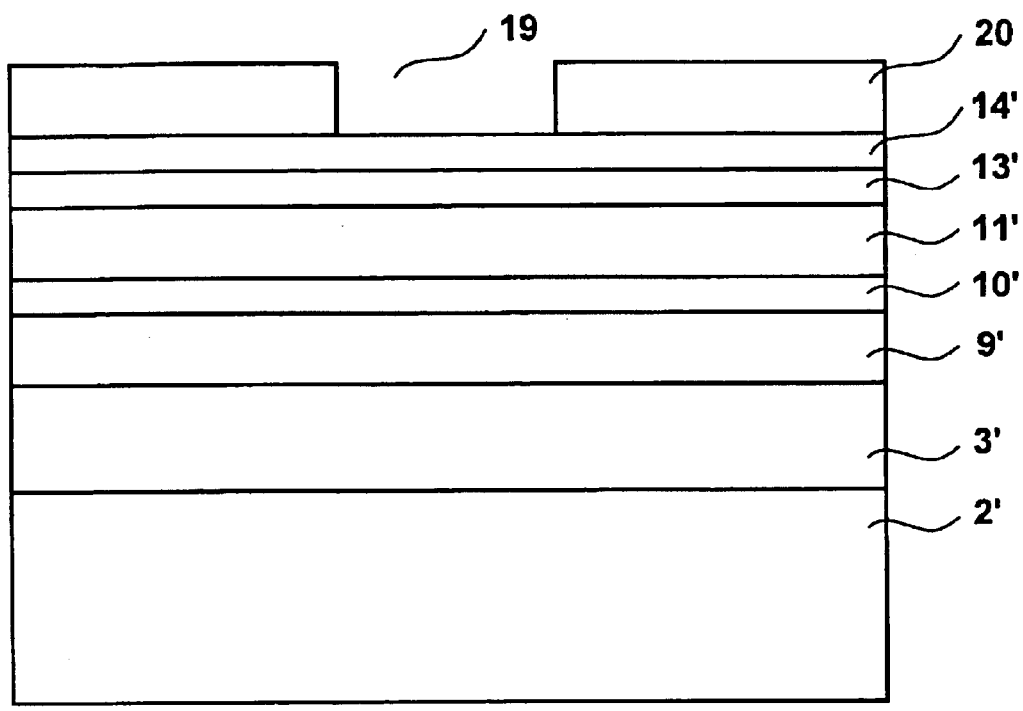
FIG. 4 shows the fabrication sequence of the first embodiment of an electron source.
Figure 4:
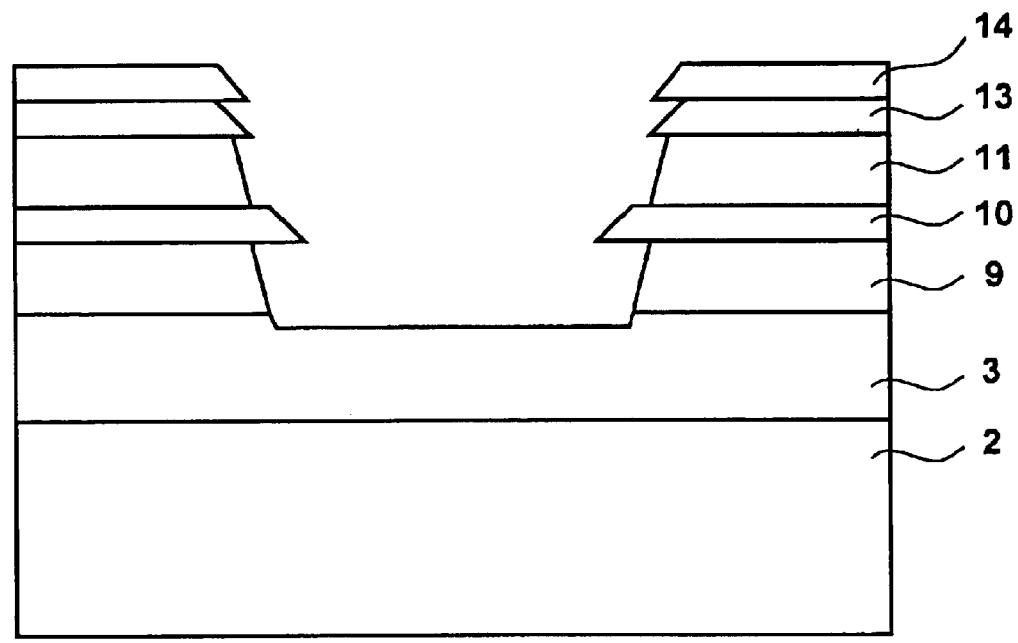
Figure 4:
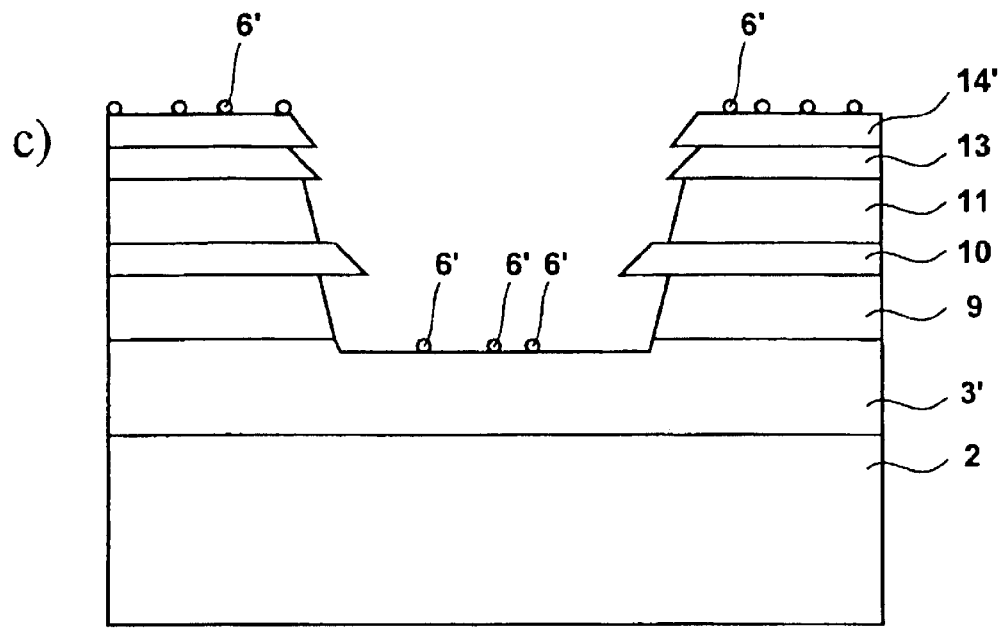
Figure 4:
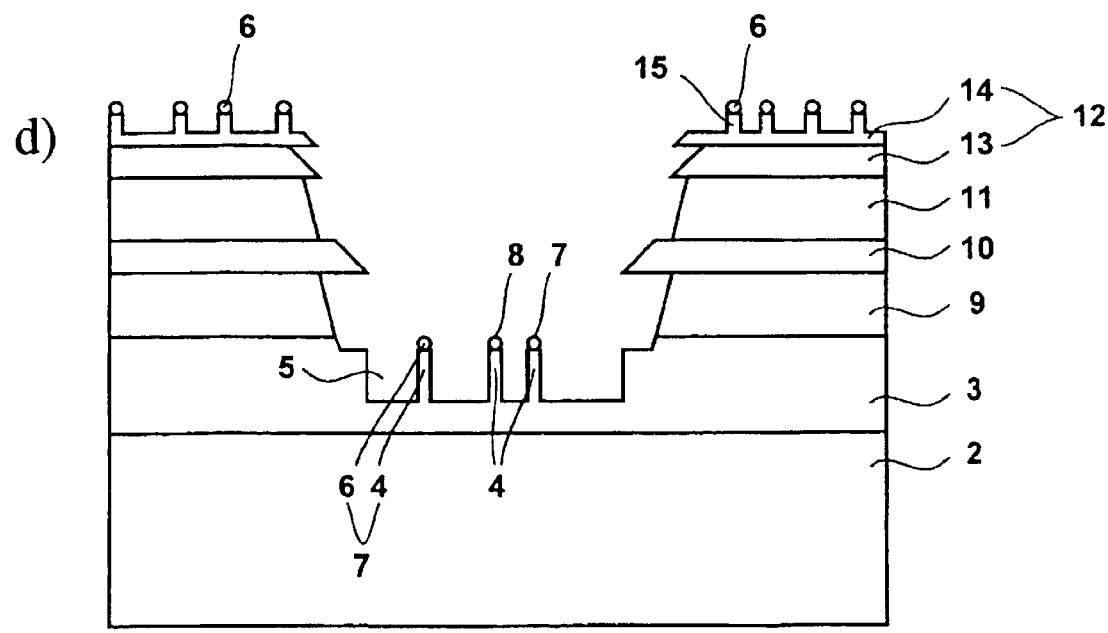

Using a 10:1 mixture of $CF_4$ and $O_2$ feed gases, a reactive ion etch (RIE) removes the unmasked portion of the aluminium layer 14' and portions of layers underlying to give the configuration as shown in FIG. 4b. The lateral extent of etching in each layer varies due to variation in exposure to the etch and due to different etch rates.

A granular thin film of gold-palladium is deposited by thermal evaporation at a pressure less than $1 \times 10^{-6}$ Torr. The film coalesces to form individual particles 6' of gold-palladium across the surface of the structure as shown in FIG. 4c. The gold-palladium particles 6' have a diameter of approximately 2–3 nm.

Using $CF_4/O_2$ RIE, the first tungsten layer 3 and the aluminium layer 14 are anisotropically etched with the gold-palladium particles 6' serving as self-aligned masks to form tungsten and aluminium posts 4, 15 respectively. During etching the gold-palladium particles 6' are reduced in size less than 1 nm to form smaller particles 6. The resulting structure is shown in FIG. 4d, which corresponds to the source 1 shown in FIGS. 1 to 3.

Second Embodiment

Electron Source Structure

Figure 5A:
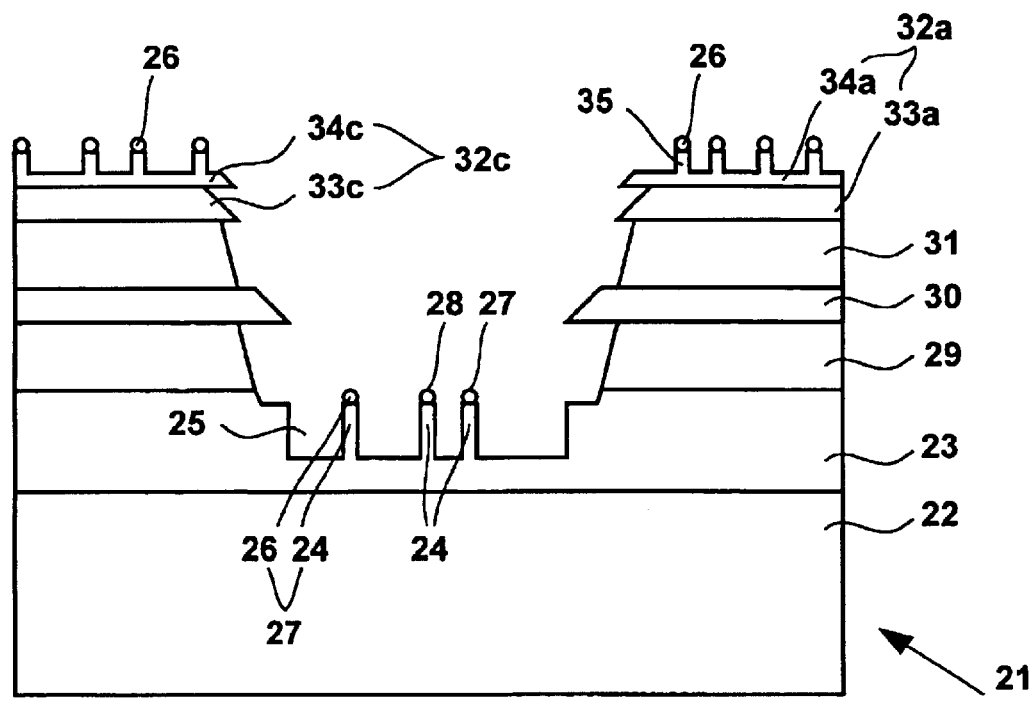
FIG. 5a is a cross-section of a second embodiment of an electron source taken along the line B–B' as shown in FIG. 6.
Figure 5B:
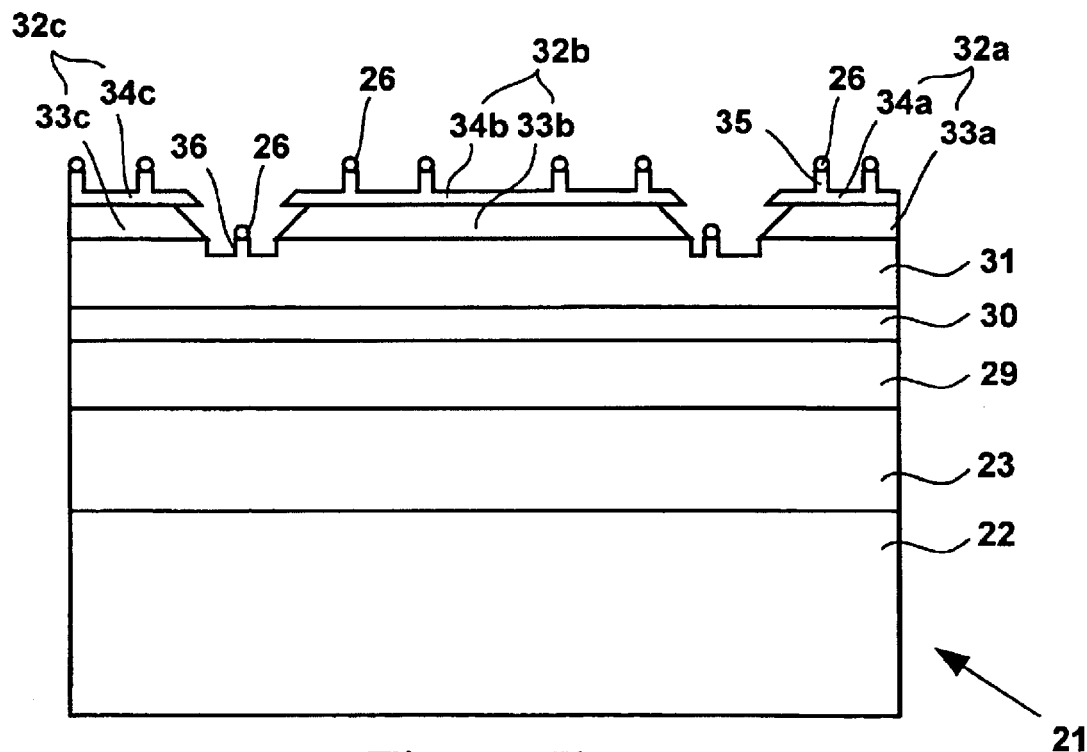
FIG. 5b is a cross-section of a second embodiment of an electron source taken along the line C–C', as shown in FIG. 6.
Figure 6:
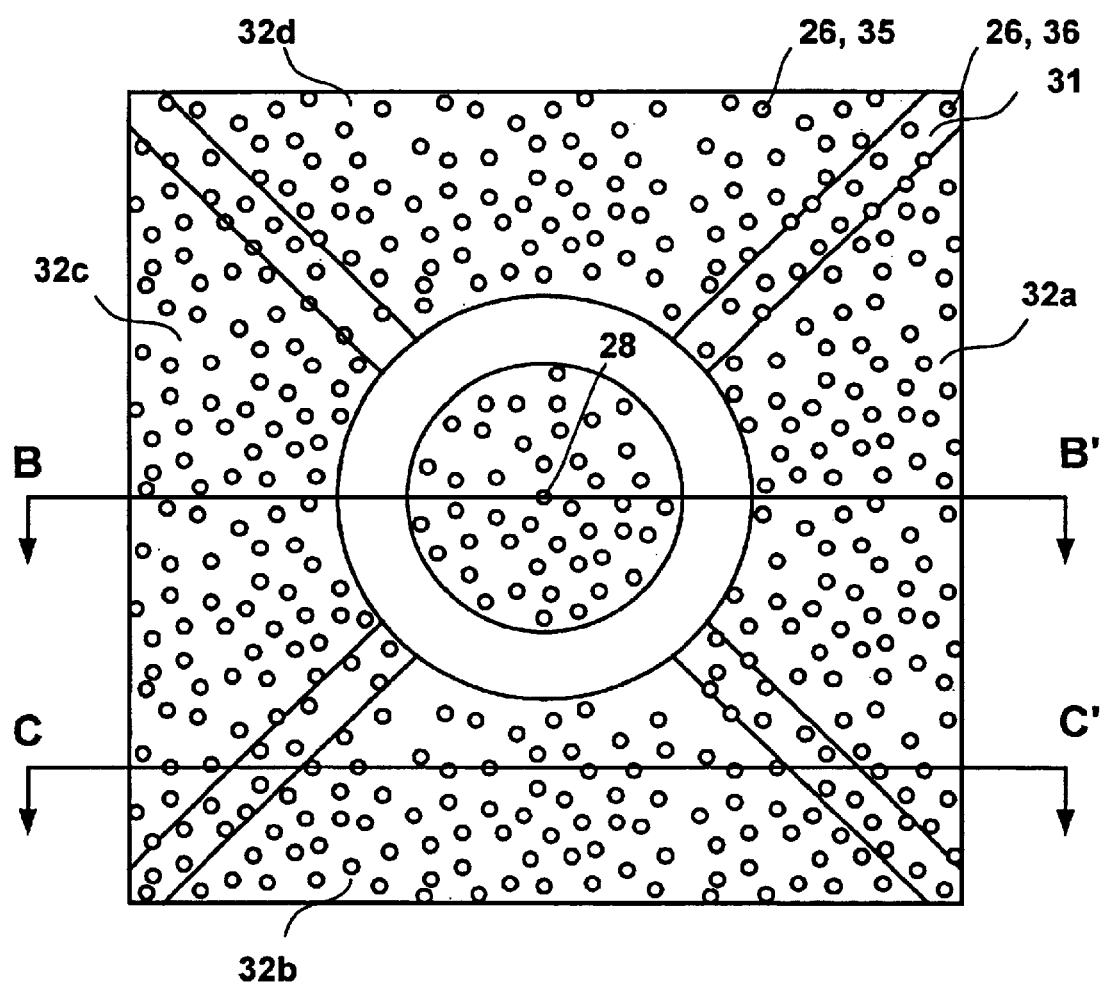
FIG. 6 is a plan view of the second embodiment of an electron source.

Referring to FIGS. 5 and 6, a second embodiment of an electron beam source 21 is shown in cross-section and plan view respectively. The second embodiment includes integral beam scanning electrodes. FIG. 5a is a cross-section of the device taken along the line B–B' as shown in FIG. 6 and FIG. 5b is a cross-section of the device taken along the line C–C', as also shown in FIG. 6.

The source 21 comprises an insulating substrate 22 on which is disposed a cathode layer 23. The insulating substrate 22 comprises silicon dioxide grown on single crystal silicon. The cathode layer 23 comprises tungsten and has a thickness of 100 nm. A plurality of conductive posts 24 are upstanding from a shallow recess 25, which is 15 nm deep and is substantially circular in plan view, in the cathode layer 23 and have particles 26 sitting thereon so as to form a plurality of pillars 27. In this example, one particle 26 sits on every post 24. The posts 24 comprise tungsten and have an aspect ratio of approximately 10 to 1. The conductive particles 26 comprise an alloy of gold and palladium and have a diameter less than 1 nm, although conductive particles 26 having diameters less than 50 nm may be used. Preferably, the conductive particles 26 have diameters less than 10 nm. More preferably, the conductive particles 26 have diameters less than 2 nm.

One of the pillars 27 forms an emitter 28 by a self-selecting process as described hereinbefore. The radius of the tip of the emitter 28 is defined by the size of the conductive particle 26.

An insulating layer 29 overlies the cathode layer 23 and separates an extractor electrode 29 from the cathode layer 23. The insulating layer 29 comprises silicon dioxide and has a thickness of 50 nm. The extractor electrode layer 30 comprises tungsten and has a thickness of 20 nm. Both the insulating layer 29 and the extractor electrode 30 have apertures, the centres of which are substantially coaxial with the centre of the recess 25. The extractor electrode 30 causes cold emission of electrons from the tip of the emitter 28, when positively biased relative to the cathode layer 23.

A dielectric layer 31, for example comprising silicon dioxide having a thickness of 50 nm, overlies the extractor electrode 30 and separates scanning electrodes 32a, 32b, 32c, 32d from the extractor electrode 30. The scanning electrodes 32a, 32b, 32c, 32d comprise a segmented scanning electrode layer 33 and a segmented capping layer 34. In this example, the scanning electrode layer 33 comprises tungsten and has a thickness of 30 nm, while the capping layer 34 comprises aluminium and has a thickness of 10 nm. The dielectric layer 31 has an aperture. The scanning electrodes 32a, 32b, 32c, 32d are arranged about an aperture, the centre of which is substantially coaxial with the centre of the recess 25. A plurality of conductive posts 35 are upstanding from the surface of the capping layer 34 furthermost from the substrate 22 and have conductive particles 26 sitting thereon so as to form a plurality of pillars. In this example, an individual particle 26 sits on every post 35. A plurality of insulating posts are upstanding from the exposed surface of the dielectric layer 31 and have conductive particles sitting thereon so as to form a plurality of pillars.

The apertures are substantially circular in plan view and have diameters of approximately 50 nm.

Configuration of the Electron on Source and Specimen

Figure 7:
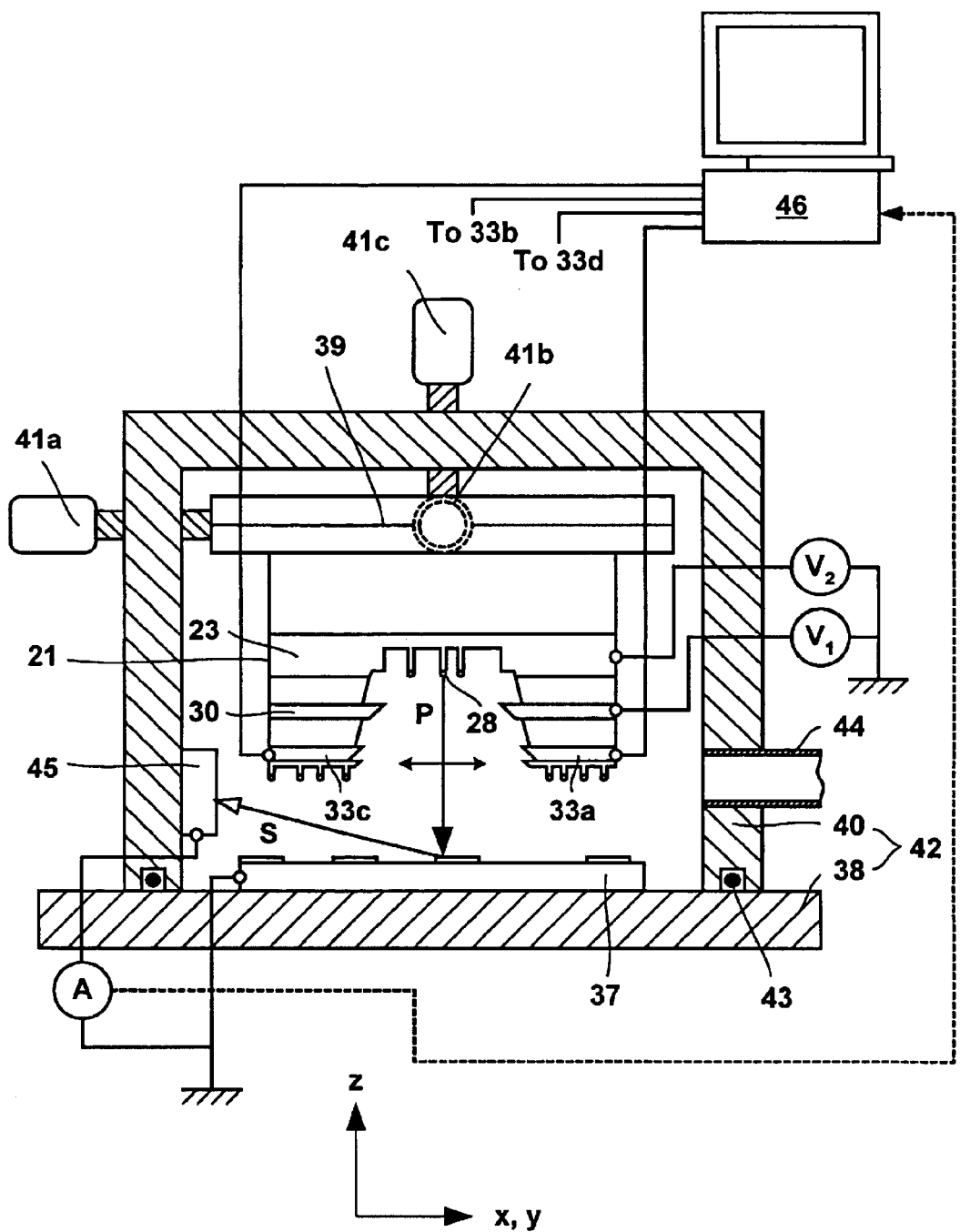
FIG. 7 shows a second embodiment of the present invention.

Referring to FIG. 7, a second embodiment of the present invention is a scanning electron microscope comprising the electron source 21 as described with reference to FIGS. 5 and 6 and a specimen 37. In this example, the specimen 37 is a semiconductor chip.

The specimen 37 is arranged substantially parallel to the layers comprising the source 21 on a base plate 38. The electron beam source 21 is arranged on a moveable stage 39 attached to the inside of chamber cover 40. The stage 39 is moved by means of x, y, and z screw gauge micrometers 41a, 41b, 41c. It will be appreciated that the stage may also be moved by means of stepper motors. A chamber 42 is formed when the chamber cover 40 sits on the base plate 38 and is sealed by a rubber 'O'-ring 43. The chamber 42 is evacuated through a vacuum line 44 connected to a vacuum system (not shown) comprising a roughing pump and a turbo molecular pump. The chamber 42 may be evacuated to a pressure lower than $1 \times 10^2$ Torr. Preferably, the chamber 42 is evacuated to a pressure lower than $1 \times 10^{-2}$ Torr.

The separation of the tip of the emitter 28 from the facing surface of the specimen 37 is about 1 μm.

To produce an electron beam P, the specimen 37 is grounded and first and second biases $V_1=-8V$ and $V_2=-15V$ are applied to the extractor electrode 30 and the cathode layer 23 respectively. However, a first bias in the range $-1 \leq V_1 \leq -10V$ and a second bias in the range $-10 \leq V_2 \leq -20V$ could be used. A person skilled in the art would be able to determine what biases may be applied to the extractor electrode 30, cathode layer 23 and the specimen 37 in order to produce an electron beam P and to prevent insulating layer and dielectric layer breakdown. This may include application of positive biases. This may also include application of biases of a greater magnitude.

The emitter 28 is the pillar 27 having the most favourable conditions for field emission as explained earlier with respect to the first embodiment.

The emitter 28 and specimen 37 form a cathode and an anode respectively. Electrons are directed in a beam P towards the specimen. A proportion of the electrons are collected by the extractor electrode 30.

The electron beam P reaches the specimen 37 having a beam diameter of approximately 200 nm or smaller. Preferably, the electron beam P will reach the specimen 37 having a beam diameter less than 40 nm. The beam diameter may be smaller than 200 nm due to a narrow emission angle from the emitter 28 and focussing by the extractor electrode 30 and the scanning electrodes 32.

In this example, the beam current is of the order of a few nanoamperes.

The electron beam P strikes the specimen 37 and generates secondary electrons S having a lower energy that the primary electrons, which are collected by a detector 45 mounted on the inside of the chamber cover 40. The detector 45 comprises a sheet metal electrode held at substantially the same potential as the sample. The electron beam P strikes the specimen 37 and generates secondary electrons S. As explained earlier, the rate of secondary electron emission is dependent upon surface composition and topography. The greater the rate of secondary electron emission, the higher the current A detected by the collector 45.

The electron beam P may be scanned by applying negative biases to the scanning electrodes 32a, 32b, 32c, 32d. The negative applied biases are of the order of 10V, although the exact values are found by means of calibration by applying test biases and measuring electron beam P deflection. Scanning of the beam P is controlled using a personal computer 46. The personal computer 46 also receives the value of current A detected by the collector 45 so is able to assemble an image of the surface of the specimen 37.

It will be appreciated that the scanning electrodes may be used for focussing. It will be appreciated that an additional dielectric and segmented electrode layers may be added to form separate focussing electrodes.

Device Fabrication

The second embodiment of an electron source 21 is fabricated using the same process steps as the first embodiment of an electron source 1. However, the polymethylmethacrylate electron beam resist 20 is patterned slightly differently.

A disc is exposed as before, to produce a circular window 19 in the electron beam resist 20. However, a cross pattern, centred on the disc, is also exposed. This cross is underexposed with the effect that the resist is thinned during development. During dry etching the thinned resist is eventually consumed, exposing the surface of the layer structure and delaying the onset of etching. The cross pattern corresponds to the cross pattern as shown in FIG. 6.

Third Embodiment

Electron Source Structure

Figure 8:
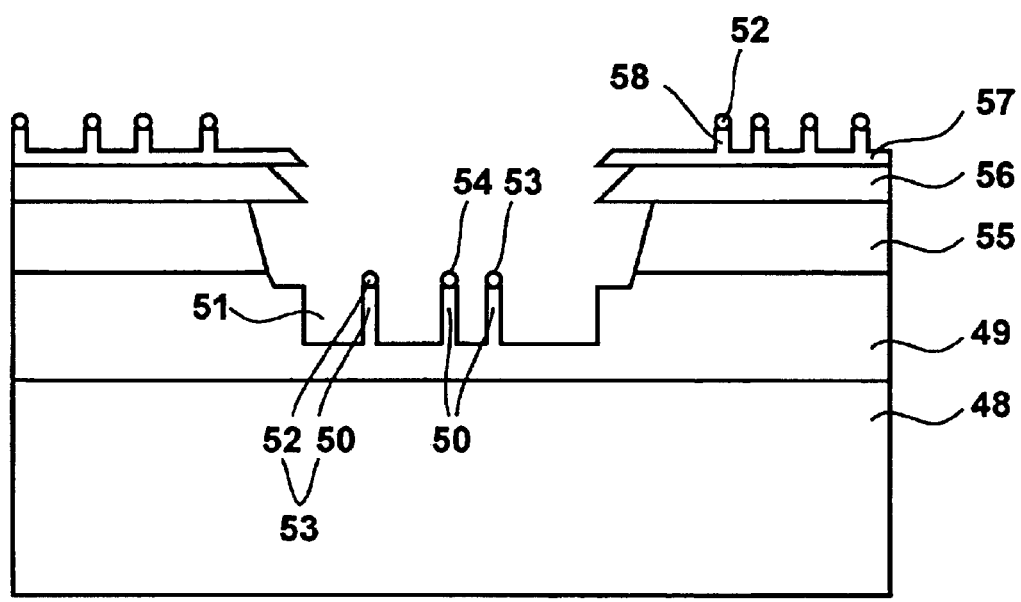
FIG. 8 is a cross-sectional view of a third embodiment of an electron source and FIG. 9 shows a third embodiment of the present invention.
Figure 9:
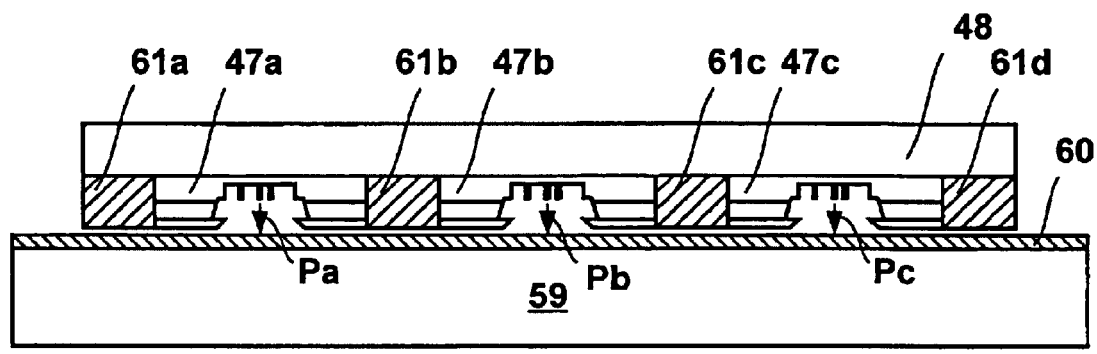

A third embodiment of an electron beam source 47 is shown in cross-section in FIG. 8 and comprises a two-electrode structure. A plurality of sources are integrated in an array on a common substrate as shown in FIG. 9.

Referring to FIG. 8, the source 47 comprises an insulating substrate 48 on which is disposed a cathode layer 49. The insulating substrate 48 comprises silicon dioxide grown on single crystal silicon. The cathode layer 49 comprises tungsten and has a thickness of 100 nm. A plurality of conductive posts 50 are upstanding from a shallow recess 51, which is 15 nm deep and is substantially circular in plan view, in the cathode layer 49 and have particles 52 sitting thereon so as to form a plurality of pillars 53. In this example, an individual particle 52 sits on each post 50 respectively. The posts 50 comprise tungsten and have an aspect ratio of approximately 10 to 1. The conductive particles 52 comprise an alloy of gold and palladium and have a diameter less than 1 nm, although the conductive particles 52 may have diameters less than 50 nm may be used. Preferably, the conductive particles 52 have diameters less than 10 nm. More preferably, the conductive particles 52 have diameters less than 2 nm.

One of the pillars 53 forms an emitter 54 by a self-selecting process as described hereinbefore. The radius of the tip of the emitter 54 is defined by the size of the conductive particle 52.

An insulating layer 55 overlies the cathode layer 49 and separates an extractor electrode 56 from the cathode layer 49. The insulating layer 55 comprises silicon dioxide and has a thickness of 50 nm. The extractor electrode layer 56 comprises tungsten and has a thickness of 20 nm. Both the insulating layer 55 and the extractor electrode 56 have apertures, the centres of which are substantially coaxial with the centre of the recess 51. The extractor electrode 56 causes cold emission of electrons from the tip of the emitter 54, when positively biased relative to the cathode layer 49.

A capping layer 57 overlies the extractor electrode 56. It comprises aluminium and has a thickness of 10 nm. A plurality of conductive posts 58 are upstanding from the surface of the capping layer 57 furthermost from the substrate 48 and have conductive particles 52 sitting thereon so as to form a plurality of pillars. In this example one particle 52 sits on every post 50.

The apertures are substantially circular in plan view and have diameters of approximately 50 nm.

Configuration of the Electron Source and Specimen

Referring to FIG. 9, an array of the electron beam sources 47 is used in parallel electron beam lithography system to expose a wafer 59 coated with electron beam resist 60.

The electron beam sources 47a, 47b, 47c share the same insulating substrate 48 and are electrically isolated from each other by laterally disposed isolation layers 61a, 61b, 61c, 61d. In this example, the electron beam sources 47a, 47b, 47c are separated from one another by 5 mm and are arranged according to a rectangular array over a circular area of about 110 square inches. It will be appreciated that the electron sources 47a, 47b, 47c may be separated by only a few 100's nm.

The array of electron beam sources 47 and the wafer are held under vacuum and the emitter 54 of each source 47 is disposed from the surface of the resist 60, by 200 to 400 nm. The emitters 54 and the resist 60 are arranged in the near-field configuration and thus there is no need to use focussing lenses.

To produce an array of electron beams Pa, Pb, Pc, the wafer is grounded and first and second pairs of biases $V_{1a}$, $V_{2a}$, $V_{1b}$, $V_{2b}$, $V_{1c}$, $V_{2c}$ are applied to the extractor electrode 56 and cathode layers 49 of each respective electron beam sources 47a, 47b, 47c. The first and second pairs of biases $V_{1a}$, $V_{2a}$, $V_{1b}$, $V_{2b}$, $V_{1c}$, $V_{2c}$ of each respective source 47a, 47b, 47c are determined during a calibration process. The process includes moving a Faraday cup from one source 47a, 47b, 47c to another, measuring the beam current and changing the first and second biases $V_{1a}$, $V_{2a}$ until a desired beam current is obtained. The first and second biases $V_{1a}$, $V_{2a}$ have values of the order of 1–10V.

To expose the resist 60, the array of sources 47 are mechanically scanned by means of an x-y stage (not shown), driven by stepper motors and whose position is determined by well-known laser interferometric techniques. The stepper motors are controlled by a personal computer (not shown).

It will be appreciated that each source 47 may be mounted on a micromachined combdrive actuated membrane disposed on a common substrate. This would allow each source to be moved independently of one another. Principles of how micromachined combdrive actuated membrane are fabricated may be found in "Integrated Polysilicon and DRIE Bulk Silicon Micromachining for an Electrostatic Torsional Actuator" by J-L. A. Yeh, H. Jiang and N. C. Tien, Journal of Micromechanical Systems, volume 8, pp 456–465 (1999). As an alternative to keeping the array of electron beam sources 47 and the wafer under vacuum using conventional pumping systems, it will be appreciated that the region about each source 47 may be evacuated using an integrated micromachined evacuation system.

Device Fabrication

The third embodiment of an electron source 47 is fabricated using similar process steps as the first embodiment of an electron source 1, but without the process steps required for the dielectric layer 11 and the capping layer 13.

It will be appreciated that many modifications may be made to the embodiments described above.

A non-insulating substrate may be used instead of an insulating substrate.

The cathode layer may be as thin as 10 nm and thicker than 100 nm.

The apertures in the electron source may have diameters of less than 100 nm.

The insulating layer or dielectric layer material may have different thicknesses in the range 10 to 50 nm and may comprise silicon nitride, tantalum oxide, titanium pentoxide or multilayer dielectric layers.

The extractor electrode material may comprise other metals, for instance gold or aluminium.

The alloy of gold and palladium may be deposited using ion-assisted deposition process with a landing energy of 100–300 eV.

Other conductive particle materials may be used other than an alloy of gold and palladium. The material should allow selectivity over the cathode layer material during dry etching. The material may have a lower work function than gold-palladium, for example alloys of caesium and barium.

The emitter may be formed out of a different material from the cathode material. The pillars may be formed by application of self-righting posts. The emitter may comprise a carbon nanotube.

The source may be used in other applications including metrology and information storage.

The secondary electron currents detected by a detector may be measured by an electrometer.

What is claimed is:

1. Apparatus for producing a flux of charge carriers comprising:
   a source which comprises and emitter having a nanometer scale tip radius on a common substrate with an extractor arranged no more than 50 nm from the emitter to extract charge carriers therefrom and
   a specimen adjacent the source, to receive a flux of charge carriers from the source.

2. Apparatus according to claim 1, wherein the emitter has a tip radius less than 2 nm.

3. Apparatus according to claim 2, wherein the emitter had a tip radius less than 1 nm.

4. Apparatus according to claim 1 wherein the extractor is arranged no more than 30 nm from the emitter.

5. Apparatus according to claim 1, wherein the emitter nad extractor are configured such that said charge carries are extracted while a bias is applied to the extractor relative to the emitter.

6. Apparatus according to claim 5, wherein the relative applied bias is positive.

7. Apparatus according to claim 5, wherein the relative applied bias is between 7 to 20 V.

8. Apparatus according to claim 1 including a bias source the apply bias to the specimen relative to the emitter.

9. Apparatus according to claim 8, wherein the bias applied by the bias source to the specimen is positive relative to the emitter.

10. Apparatus according to claim 8, wherein the bias applied by the bias source to the specimen is between 14 to 40 V relative to the emitter.

11. Apparatus according to claim 1, wherein the emitter comprises a metal.

12. Apparatus according to claim 11, wherein the metal comprises tungsten.

13. Apparatus according to claim 12, wherein the emitter comprises a tip member.

14. Apparatus according to claim 13, wherein the tip member comprises an alloy of gold and palladium.

15. Apparatus according to claim 13, wherein the tip member has a tip radius less than 2 nm.

16. Apparatus according to claim 1 wherein the extractor comprises tungsten.

17. Apparatus according to claim 1, wherein the extractor comprises a sheet having an aperture.

18. Apparatus according to claim 17, wherein the diameter of the aperture is less than 100 nm.

19. Apparatus according to claim 18, wherein the diameter of the aperture is less than 50 nm.

20. Apparatus according to claim 1, wherein the source further comprises a collector for collecting charge carriers.

21. Apparatus according to claim 1, wherein the source further comprises a deflector for deflecting flux of charge carriers.

22. Apparatus according to claim 1, wherein the source further comprises a lens for focusing the flux of charge carriers.

23. Apparatus according to claim 1, wherein the flux of charge carriers is a charge carrier beam.

24. Apparatus according to claim 1 configured to operate in air at atmospheric pressure.

25. Apparatus according to claim 1, wherein the charge carriers are electrons.

26. Apparatus according to claim 1, wherein the emitter and the specimen are disposed less than 20 nm from each other.

27. Apparatus for producing a flux of charge carriers comprising:

a source which comprises an emitter and an extractor to extract charge carriers from an emitter, wherein the emitter and the extractor are configured on a common substrate and a specimen, wherein the emitter and the specimen are arranged in a near-field configuration.

28. Apparatus according to claim 27, wherein the near-filed configuration phase coherence of the charge carries is substantially maintained.

29. Apparatus according to claim 27, wherein the near-filed configuration comprises an arrangement whereby the emitter and the specimen are disposed less than 200 nm from each other.

30. Apparatus according to claim 27, wherein the extractor is arranged no more than 50 n from the emitter.

31. Apparatus according to claim 27, wherein the extractor is arranged no more than 30 nm from the emitter.

32. Apparatus for producing a flux of charge carriers comprising:

a source which comprises:

an extractor to extract charge carrier from the emitter, wherein the emitter and the extractor are configured so as to allow extraction of charge carriers under a gaseous atmosphere without ionisation of the gas and a specimen adjacent to the source, to receive a flux of charge carriers from the source.

33. Apparatus according to claim 32, wherein the emitter and extractor are configured such that said charge carriers are extracted while a bias is applied to the extractor relative to the emitter.

34. Apparatus according to claim 33, wherein the relative applied bias is positive.

35. Apparatus according to claim 34, wherein the relative applied bias is between 7 to 20 V.

36. Apparatus for producing a flux of charge carriers comprising:

a source which comprises:

an emitter and an extractor to extract charge carriers while a turn-on bias of less than 100 V is applied to the extractor relative to the emitter and a specimen adjacent the source, to receive a flux of charge carriers from the source.

37. Apparatus according to claim 36, wherein the turn-on bias is less than 10 V.

38. A method of producing a flux of charge carriers, the method comprising:

providing a source comprising configuring an emitter having a nanometer scale tip radius on a substrate with an extractor arranged no more than 50 nm from the emitter ti extract charge carriers therefrom and providing a specimen adjacent the source, to receive a flux of charge carriers from the source.

* * * * *